(12) United States Patent
Yu et al.

(10) Patent No.: US 11,477,886 B2
(45) Date of Patent: Oct. 18, 2022

(54) CIRCUIT BOARD STRUCTURE AND SPLICED CIRCUIT BOARD

(71) Applicant: Unimicron Technology Corp., Taoyuan (TW)

(72) Inventors: Yunn-Tzu Yu, Taoyuan (TW); Ching-Ho Hsieh, Taoyuan (TW); Wang-Hsiang Tsai, Taoyuan (TW)

(73) Assignee: Unimicron Technology Corp., Taoyuan (TW)

( * ) Notice: Subject to any disclaimer, the term of this patent is extended or adjusted under 35 U.S.C. 154(b) by 0 days.

(21) Appl. No.: 17/367,419

(22) Filed: Jul. 5, 2021

(65) Prior Publication Data
US 2022/0232702 A1 Jul. 21, 2022

Related U.S. Application Data

(60) Provisional application No. 63/140,211, filed on Jan. 21, 2021.

(30) Foreign Application Priority Data

May 13, 2021 (TW) .................................. 110117242

(51) Int. Cl.
  *H05K 1/14* (2006.01)
  *H05K 1/11* (2006.01)
(52) U.S. Cl.
  CPC ............. *H05K 1/144* (2013.01); *H05K 1/117* (2013.01); *H05K 2201/041* (2013.01)
(58) Field of Classification Search
  CPC .......... H05K 1/117; H05K 1/14; H05K 1/144; H05K 2201/041

USPC ......................................................... 174/261
See application file for complete search history.

(56) References Cited

U.S. PATENT DOCUMENTS

| | | |
|---|---|---|
| 2019/0043792 A1 | 2/2019 | Weerasekera et al. |
| 2020/0286847 A1 | 9/2020 | Liu et al. |

FOREIGN PATENT DOCUMENTS

| | | |
|---|---|---|
| TW | 201401952 | 1/2014 |
| TW | I685098 | 2/2020 |

OTHER PUBLICATIONS

"Office Action of Taiwan Counterpart Application", dated Nov. 18, 2021, p. 1-p. 6.

*Primary Examiner* — Tremesha S Willis
(74) *Attorney, Agent, or Firm* — JCIPRNET

(57) ABSTRACT

A circuit board structure includes a body, multiple first pads, a conductive assembly, multiple first engaging components, and multiple second engaging components. The body includes a first portion and a second portion integrally formed. A first surface of the first portion directly contacts a second surface of the second portion. A first region of the first surface protrudes from the second portion, and a second region of the second surface protrudes from the first portion. The first pads and the first engaging components are disposed on the first portion of the body and located in the first region of the first surface. The conductive assembly and the second engaging components are disposed on the second portion of the body and located in the second region of the second portion. The first pads are located between the first engaging components, and the conductive assembly is located between the second engaging components.

20 Claims, 17 Drawing Sheets

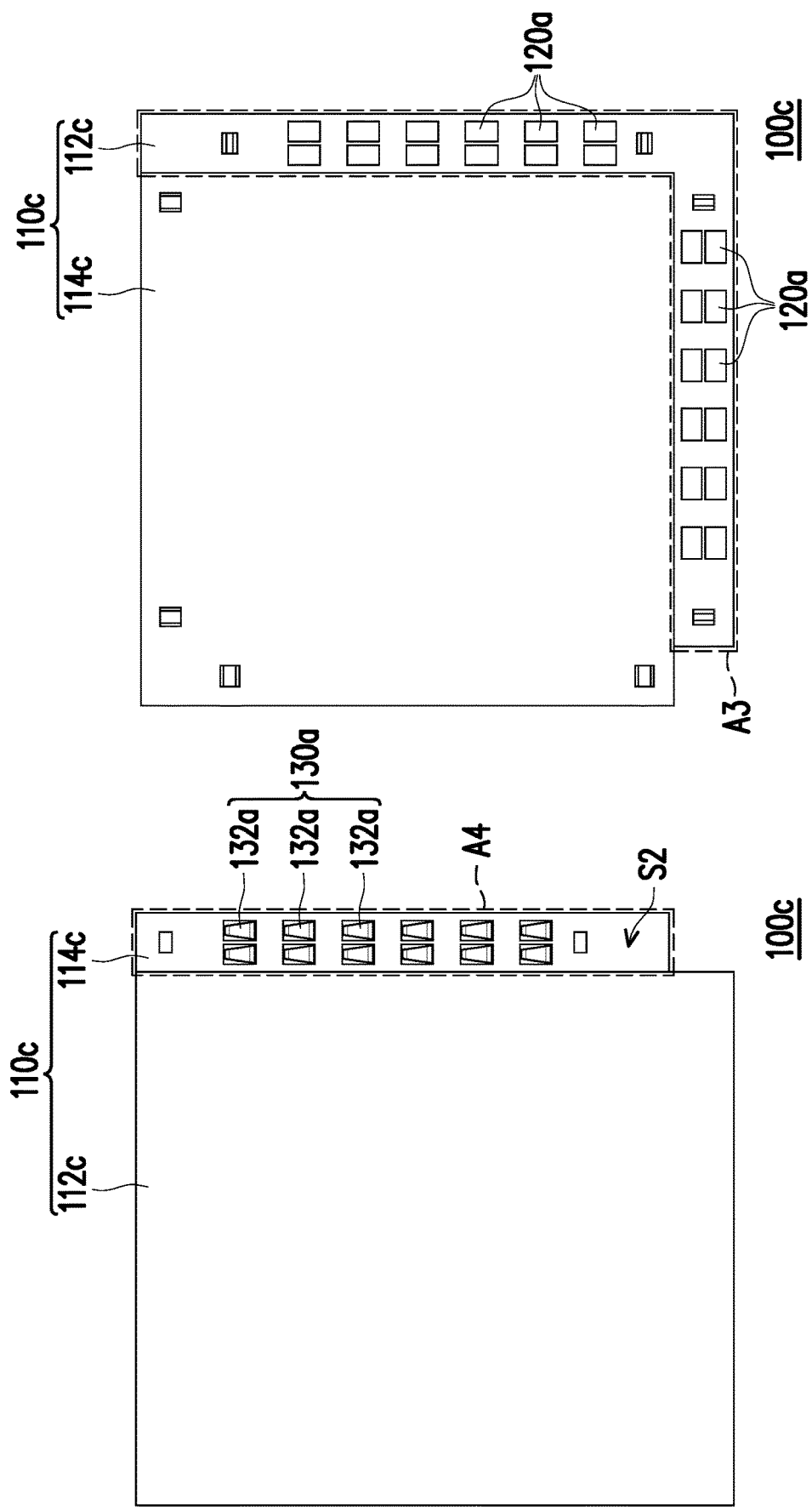

CIRCUIT BOARD STRUCTURE AND SPLICED CIRCUIT BOARD

CROSS-REFERENCE TO RELATED APPLICATION

This application claims the priority benefits of U.S. provisional application Ser. No. 63/140,211, filed on Jan. 21, 2021, and Taiwanese application serial no. 110117242, filed on May 13, 2021. The entirety of each of the above-mentioned patent applications is hereby incorporated by reference herein and made a part of this specification.

BACKGROUND

Technical Field

The disclosure relates to a board structure, in particular to a circuit board structure and a spliced circuit board using this circuit board structure.

Description of Related Art

Generally speaking, large-area circuit boards are prone to have low yield rate during production, and large-area boards are prone to substrate warpage. In order to solve the above problems, small-area circuit boards are currently spliced together to form large circuit boards to overcome the above process yield rate and substrate warpage problems. In today's connected boards, a connector is placed on the board to electrically connect two small boards into a larger board by plugging the male plug into the female socket. However, the connector is relatively thick and the connection strength is not stable, so the above circuit boards with connectors are not suitable for splicing into a large-area circuit board.

SUMMARY

The disclosure provides a circuit board structure suitable for splicing and having a favorable production yield rate.

The disclosure provides a spliced circuit board including multiple circuit board structures, which may improve production yield rate and reduce waste to reduce production costs.

The circuit board structure of the disclosure includes a body, multiple first pads, a conductive assembly, multiple first engaging components, and multiple second engaging components. The body includes a first portion and a second portion, in which the first portion and the second portion are integrally formed. A first surface of the first portion directly contacts a second surface of the second portion. A first region of the first surface protrudes from the second portion, and a second region of the second surface protrudes from the first portion. The first pads are disposed on the first portion of the body and are located in the first region of the first surface. The conductive assembly is disposed on the second portion of the body and is located in the second region of the second surface. The first engaging components are disposed on the first portion of the body and are located in the first region of the first surface. The first pads are located between the first engaging components. The second engaging components are disposed on the second portion of the body and are located in the second region of the second surface. The conductive assembly is located between the second engaging components.

According to an embodiment of the disclosure, the conductive assembly includes multiple conductive spring sheets embedded on the second surface of the second portion.

According to an embodiment of the disclosure, the first region and the second region are respectively an L-shaped region.

According to an embodiment of the disclosure, the first region is an L-shaped region, and the second region is a long-striped region.

According to an embodiment of the disclosure, one of each of the first engaging components and each of the second engaging components is a slot hole, and an other of the each of the first engaging components and the each of the second engaging components is a snap.

According to an embodiment of the disclosure, the first portion has multiple first grooves extending inward from the first surface. The second portion has multiple second grooves extending inward from the second surface. The first engaging components are respectively disposed in the first grooves, and the second engaging components are respectively disposed in the second grooves.

According to an embodiment of the disclosure, one of each of the first engaging components and each of the second engaging components is a pin, and an other of the each of the first engaging components and the each of the second engaging components is an elastic terminal.

According to an embodiment of the disclosure, the circuit board structure further includes multiple second pads disposed on the second portion of the body and located in the second region of the second surface. The conductive assembly includes a substrate, multiple conductive spring sheets and multiple third engaging components. The conductive spring sheets are disposed on the substrate and are arranged correspondingly to the second pads. The third engaging components penetrate the substrate and are respectively engaged and fixed to the second engaging components, so that the conductive assembly is positioned on the second region of the second surface.

According to an embodiment of the disclosure, one of each of the second engaging components and each of the third engaging components is a slot hole, and an other of the each of the second engaging components and the each of the third engaging components is a locking block.

According to an embodiment of the disclosure, the circuit board structure further includes multiple second pads disposed on the second portion of the body and located in the second region of the second surface. The conductive assembly includes a substrate and multiple conductive spring sheets. The conductive spring sheets are disposed on the substrate and are respectively arranged correspondingly to the second pads.

A spliced circuit board of the disclosure includes multiple circuit board structures. Each of the circuit board structures includes a body, multiple first pads, a conductive assembly, multiple first engaging components, and multiple second engaging components. The body includes a first portion and a second portion, in which the first portion and the second portion are integrally formed. A first surface of the first portion directly contacts a second surface of the second portion. A first region of the first surface protrudes from the second portion, and a second region of the second surface protrudes from the first portion. The first pads are disposed on the first portion of the body and are located in the first region of the first surface. The conductive assembly is disposed on the second portion of the body and is located in the second region of the second surface. The first engaging components are disposed on the first portion of the body and are located in the first region of the first surface. The first pads are located between the first engaging components. The second engaging components are disposed on the second portion of the body and are located in the second region of the second surface. The conductive assembly is located between the second engaging components. The circuit board structures include a first circuit board structure and a second circuit board structure. The first circuit board structure is respectively engaged and fixed to the second engaging components of the second circuit board structure through the first engaging components, so that the first pads of the first circuit board structure are respectively electrically connected to the conductive assembly of the second circuit board structure.

According to an embodiment of the disclosure, the conductive assembly includes multiple conductive spring sheets embedded on the second surface of the second portion.

According to an embodiment of the disclosure, the first region and the second region are respectively an L-shaped region.

According to an embodiment of the disclosure, the first region is an L-shaped region, and the second region is a long-striped region.

According to an embodiment of the disclosure, one of each of the first engaging components and each of the second engaging components is a slot hole, and an other of the each of the first engaging component and the each of the second engaging components is a snap.

According to an embodiment of the disclosure, the first portion has multiple first grooves extending inward from the first surface. The second portion has multiple second grooves extending inward from the second surface. The first engaging components are respectively disposed in the first grooves, and the second engaging components are respectively disposed in the second grooves.

According to an embodiment of the disclosure, one of each of the first engaging components and each of the second engaging components is a pin, and an other of the each of the first engaging components and the each of the second engaging components is an elastic terminal.

According to an embodiment of the disclosure, the each of the circuit board structures further includes multiple second pads disposed on the second portion of the body and located in the second region of the second surface. The conductive assembly includes a substrate, multiple conductive spring sheets, and multiple third engaging components. The conductive spring sheets are disposed on the substrate and are arranged correspondingly to the second pads. The third engaging components penetrate the substrate and are respectively engaged and fixed to the second engaging components, so that the conductive assembly is positioned on the second surface of the second region. The first circuit board structure is respectively engaged and fixed to the second engaging components engaged and fixed by the third engaging components through the first engaging components, so that the first pads of the first circuit board structure are respectively electrically connected to the conductive assembly located on the second circuit board structure.

According to an embodiment of the disclosure, each of the first engaging components is a pin, each of the second engaging components is a terminal, and each of the third engaging components is a slot hole.

According to an embodiment of the disclosure, the each of the circuit board structures further includes multiple second pads disposed on the second portion of the body and located in the second region of the second surface. The conductive assembly includes a substrate and multiple conductive spring sheets. The conductive spring sheets are disposed on the substrate and are respectively arranged correspondingly to the second pads. The first circuit board structure is respectively engaged and fixed to the second engaging components of the second circuit board structure through the first engaging components, so that the first pads of the first circuit board structure are respectively electrically connected to the conductive assembly located in the second circuit board structure.

Based on the above, in the circuit board structure of the disclosure, the first pads and the first engaging components are disposed in the first portion of the body and are located in the first region of the first surface protruding from the second portion. The conductive assembly and the second engaging components are disposed in the second portion of the body, and are located in the second region of the second surface protruding from the first portion. Therefore, when splicing the first circuit board structure and the second circuit board structure, the first circuit board structure may be respectively engaged and fixed to the second engaging components of the second circuit board structure through the first engaging components, so that the first pads of the first circuit board structure are respectively electrically connected to the conductive assembly of the second circuit board structure. In this way, the circuit board structure of the disclosure is not only suitable for splicing, which may be spliced with each other to form a large-area spliced circuit board, but also, because of small size, capable of avoiding the conventional problem of board warpage, which may have favorable production yield rate. In addition, the manufacturing yield rate may be improved by using the spliced circuit board spliced by the circuit board structures of the disclosure, and the defective circuit board structures may be easy to replace, which may reduce waste to reduce production costs.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

FIG. 3A is a schematic top view of a circuit board structure according to another embodiment of the disclosure.

FIG. 3B is a schematic bottom view of the circuit board structure of FIG. 3A.

DESCRIPTION OF THE EMBODIMENTS

Figure 1A:
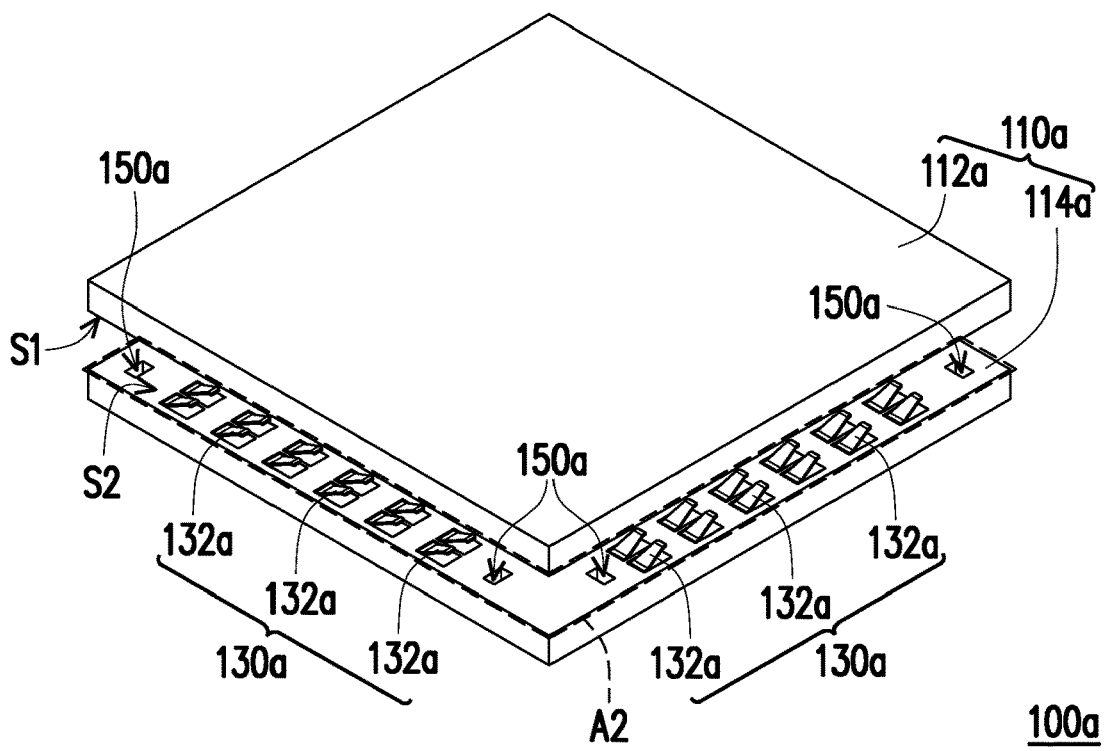
FIG. 1A is a three-dimensional schematic view of a circuit board structure according to an embodiment of the disclosure.
Figure 1B:
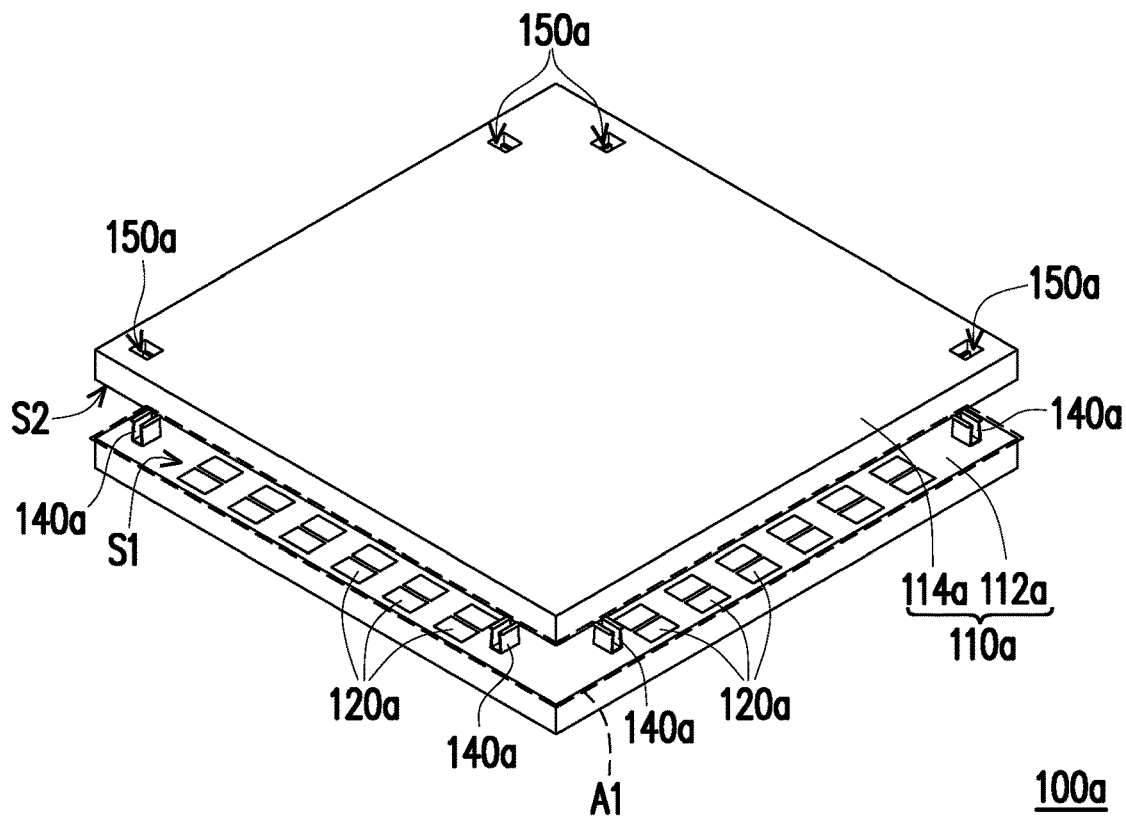
FIG. 1B is a three-dimensional schematic view of the circuit board structure of FIG. 1A from another perspective.
Figure 1C:
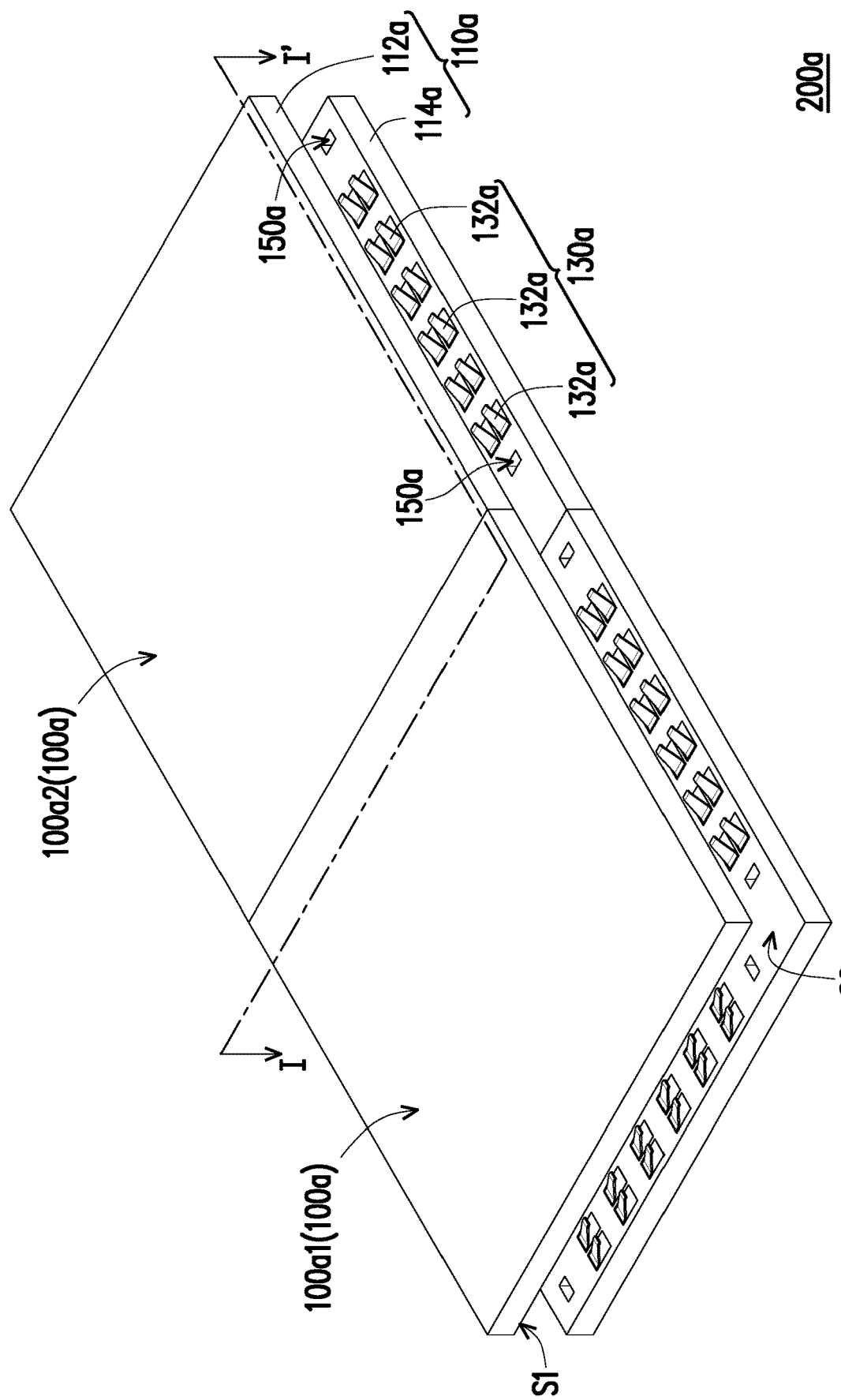
FIG. 1C is a three-dimensional schematic view of multiple circuit board structures of FIG. 1A being spliced into a spliced circuit board.
Figure 1D:
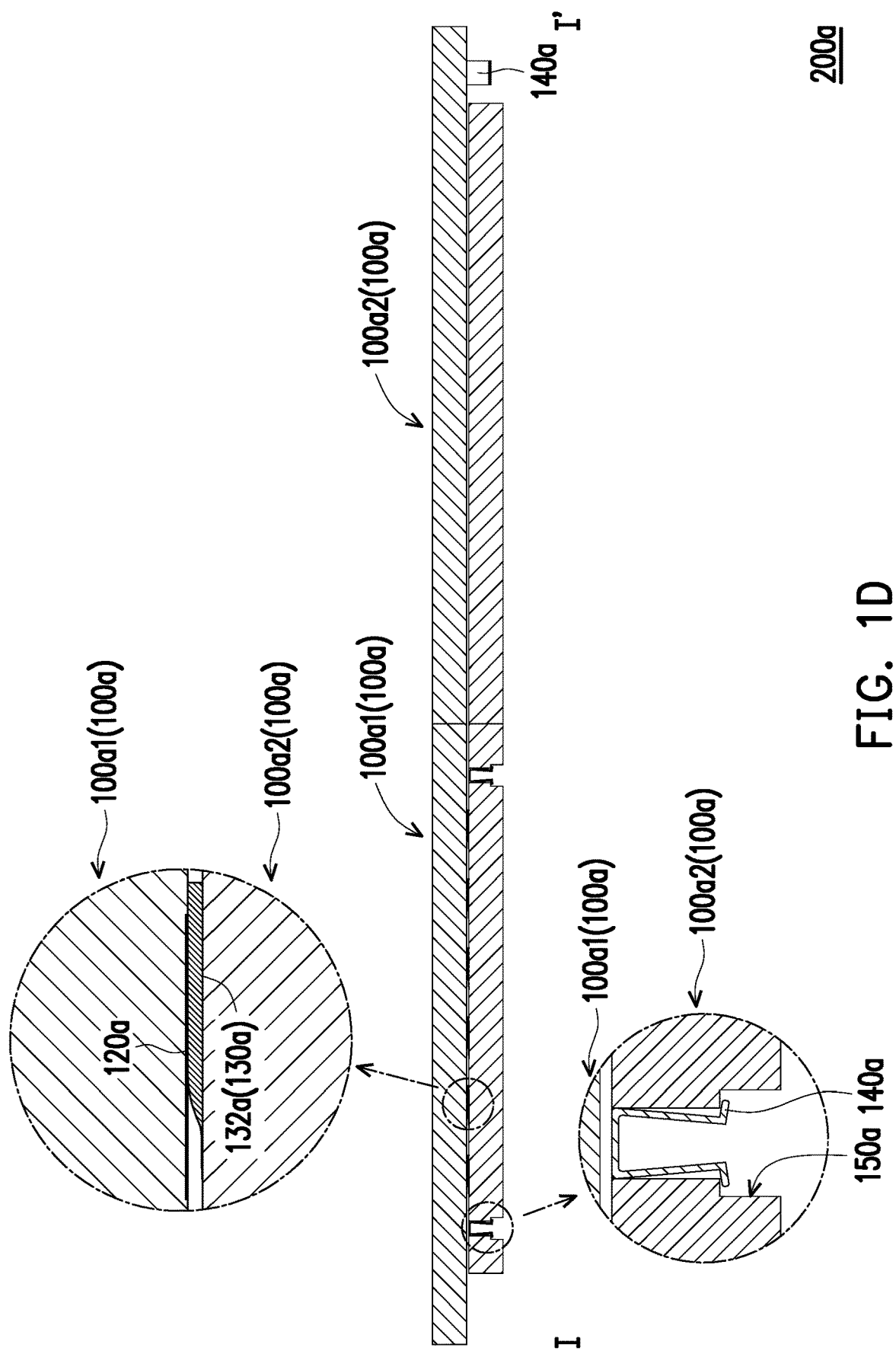
FIG. 1D is a schematic cross-sectional view taken along a line I to I' of FIG. 1C.

FIG. 1A is a three-dimensional schematic view of a circuit board structure according to an embodiment of the disclosure. FIG. 1B is a three-dimensional schematic view of the circuit board structure of FIG. 1A from another perspective. FIG. 1C is a three-dimensional schematic view of multiple circuit board structures of FIG. 1A being spliced into a spliced circuit board. FIG. 1D is a schematic cross-sectional view taken along a line I to I' of FIG. 1C.

Referring to FIG. 1A and FIG. 1B at the same time. According to this embodiment, a circuit board structure 100a includes a body 110a, multiple first pads 120a, a conductive assembly 130a, multiple first engaging components 140a, and multiple second engaging components 150a. The body 110a includes a first portion 112a and a second portion 114a, in which the first portion 112a and the second portion 114a are integrally formed. A first surface S1 of the first portion 112a directly contacts a second surface S2 of the second portion 114a. A first region A1 of the first surface S1 protrudes from the second portion 114a, and a second region A2 of the second surface S2 protrudes from the first portion 112a. The first pads 120a are disposed on the first portion 112a of the body 110a, and are located in the first region A1 of the first surface S1. The conductive assembly 130a is disposed in the second portion 114a of the body 110a, and is located in the second region A2 of the second surface S2. The first engaging components 140a are disposed on the first portion 112a of the body 110a, and are located in the first region A1 of the first surface S1. The first pads 120a are located between the first engaging components 140a. The second engaging components 150a are disposed on the second portion 114a of the body 110a, and are located in the second region A2 of the second surface S2. The conductive assembly 130a is located between the second engaging components 150a.

In detail, according to this embodiment, an overall thickness of the body 110a (that is, a thickness of the first portion 112a plus a thickness of the second portion 114a) is, for example, 0.4 mm to 3.5 mm. As shown in FIG. 1A and FIG. 1B, the first region A1 and the second region A2 according to this embodiment are respectively an L-shaped region. That is, the first portion 112a protrudes two adjacent sides relative to the second portion 114a, and the second portion 114a protrudes two adjacent sides relative to the first portion 112a. The first pads 120a and the first engaging components 140a are located in the first region A1 of the first surface S1, and the conductive assembly 130a and the second engaging components 150a are located in the second region A2 of the second surface S2. The conductive assembly 130a includes multiple conductive spring sheets 132a embedded on the second surface S2 of the second portion 114a. That is, the conductive spring sheets 132a here are single-sided spring sheets. One of the first engaging components 140a and the second engaging components 150a is a slot hole, and the other of the first engaging components 140a and the second engaging components 150a is a snap. Here, the first engaging component 140a is specified as the snap, and the second engaging component 150a is specified as the slot hole.

In other words, the circuit board structure 100a according to this embodiment includes electrical connection components (i.e., the first pads 120a and the conductive assembly 130a) and structural fixing components (i.e., the first engaging components 140a and the second engaging components 150a), so the circuit board structure 100a according to this embodiment is suitable for splicing. Here, the circuit board structure 100a can be regarded as a type for middle unit, which is suitable for splicing with another circuit board structure 100a on two adjacent sides. Furthermore, the circuit board structure 100a according to this embodiment solves the conventional problem of the board warpage by cutting the board into a smaller area and thus keeping the board warpage to an acceptable level. In this way, in addition to reducing the defect rates of the circuit board, the defect rates of connecting to electronic component packing units may also be reduced. The electronic component packing units are not limited to various scales of LED product applications and may have favorable production yield rate.

Next, referring to FIG. 1C and FIG. 1D at the same time, multiple circuit board structures 100a in FIG. 1A are spliced. A first circuit board structure 100a1 is engaged and fixed to the second engaging components 150a of a second circuit board structure 100a2 through the first engaging components 140a, so that the first pads 120a of the first circuit board structure 100a1 are electrically connected to the conductive assembly 130a of the second circuit board structure 100a2. In other words, when the first circuit board structure 100a1 and the second circuit board structure 100a2 are spliced together, the first engaging components 140a on one circuit board structure 100a are engaged to the second engaging components 150a on the other circuit board structure 100a to fix the positions of the two circuit board structures 100a, so that screws are not required, which is easy for assembly and disassembly. At the same time, the first pads 120a on one circuit board structure 100a are electrically connected to the conductive assembly 130a on the other circuit board structure 100a by contact, and the splicing of the two circuit board structures 100a is completed to form a spliced circuit board 200a.

As shown in FIG. 1D, according to this embodiment, the first engaging component 140a (i.e., the snap) is flexible enough to squeeze both sides into the narrower aperture of the second engaging component 150a (i.e., the slot hole), and when the snap reaches the wider aperture of the slot hole, the snap can pop open and hooked on the edge to fix. It should be noted that structures of the snap and the slot hole are not limited here, as long as they can be engaged and fixed to each other, that is the scope of protection intended by this embodiment. In addition, the spliced circuit board 200a according to the embodiment is suitable for carrying electronic components, such as, but not limited to, light-emitting diode (LED), micro-light-emitting diode (Micro LED) or sub-millimeter light-emitting diode (mini LED), which may form large-size display modules in addition to reducing the area of mass transfer. When the light-emitting diode on one circuit board structure 100a is damaged, the circuit board structure 100a can be directly replaced, which can reduce the repair time of the light-emitting diode.

In short, the spliced circuit board 200a spliced by the circuit board structure 100a according to this embodiment may not only improve the production yield rate, but also reduce the production cost by reducing the waste because the first engaging components 140a and the second engaging components 150a are designed in such a way that the defective circuit board structure 100a can be easily replaced. In addition, the spliced circuit board 200a is substantially or roughly co-planar, meaning that the opposite surfaces of the first circuit board structure 100a1 and the second circuit board structure 100a2 are substantially or roughly tangential. The first region A1 of the first circuit board structure 100a1 may be fitted with the second region A2 of the second circuit board structure 100a2 to form a co-planar surface.

It should be noted that in the following embodiments, the reference numerals and a part of the contents of the above embodiments are used, the same reference numerals are used to denote the same or similar elements, and the description of the same technical contents is omitted. For the description of the omitted part, reference may be made to the above embodiments, and details are not iterated in the embodiment.

Figure 2A:
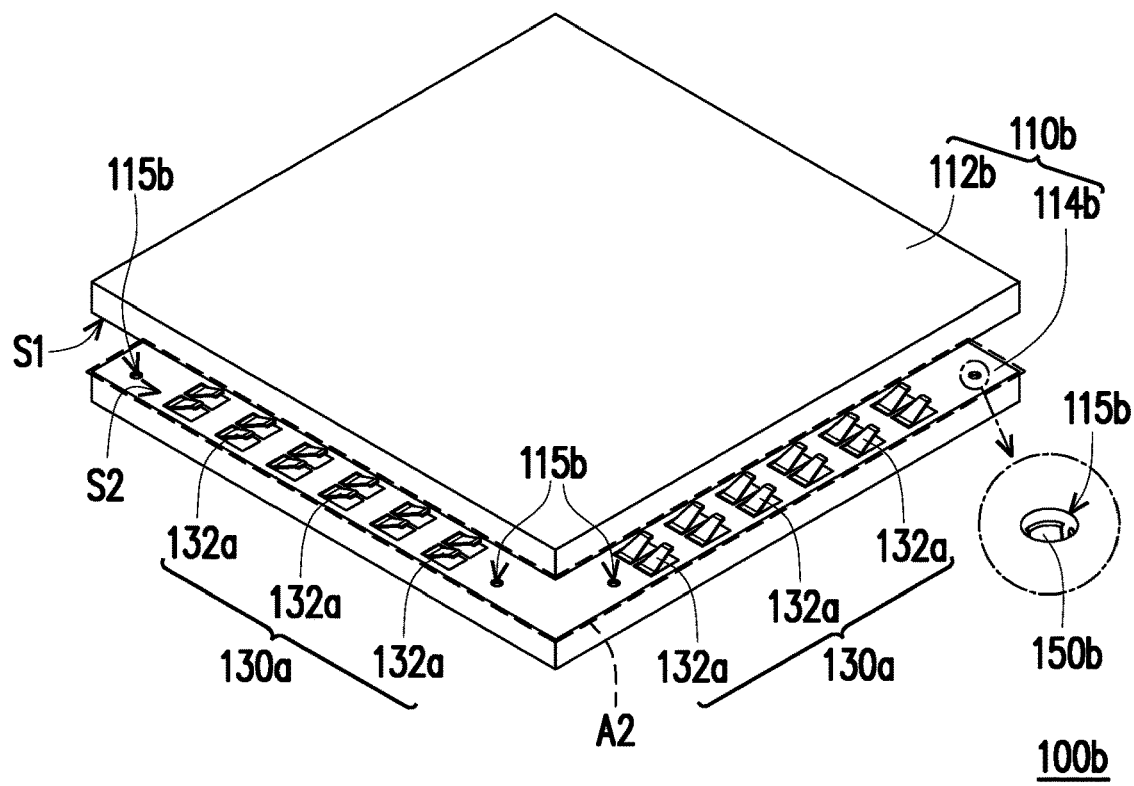
FIG. 2A is a three-dimensional schematic view of a circuit board structure according to another embodiment of the disclosure.
Figure 2B:
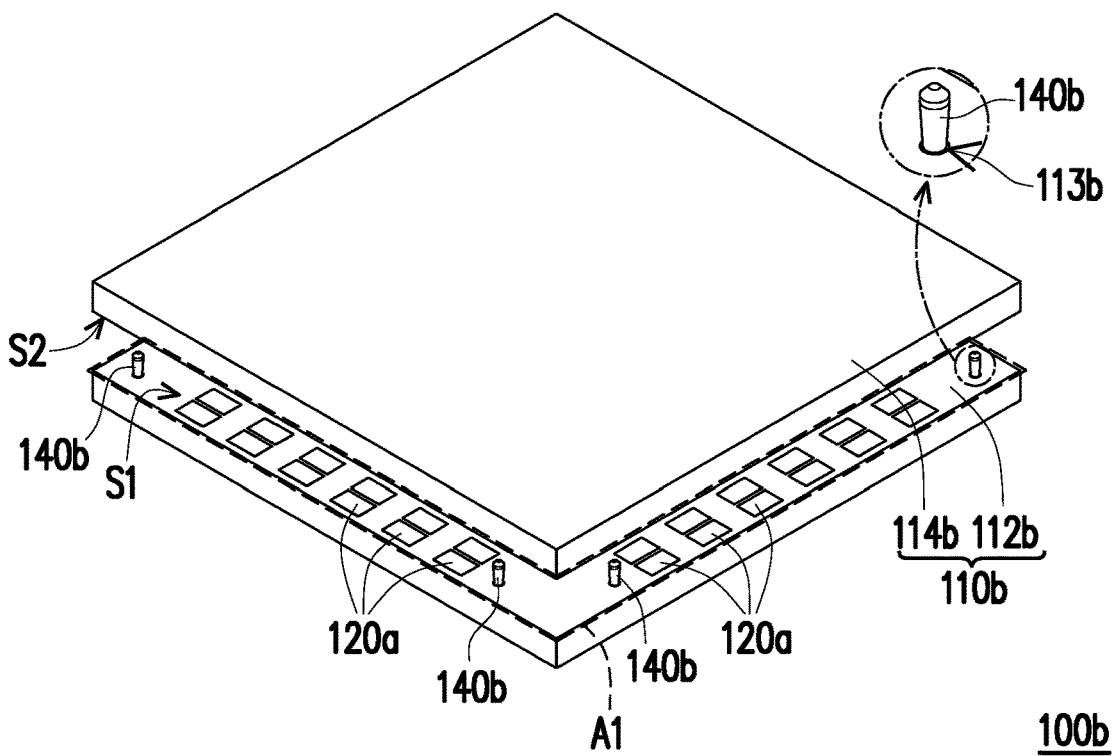
FIG. 2B is a three-dimensional schematic view of the circuit board structure of FIG. 2A from another perspective.
Figure 2C:
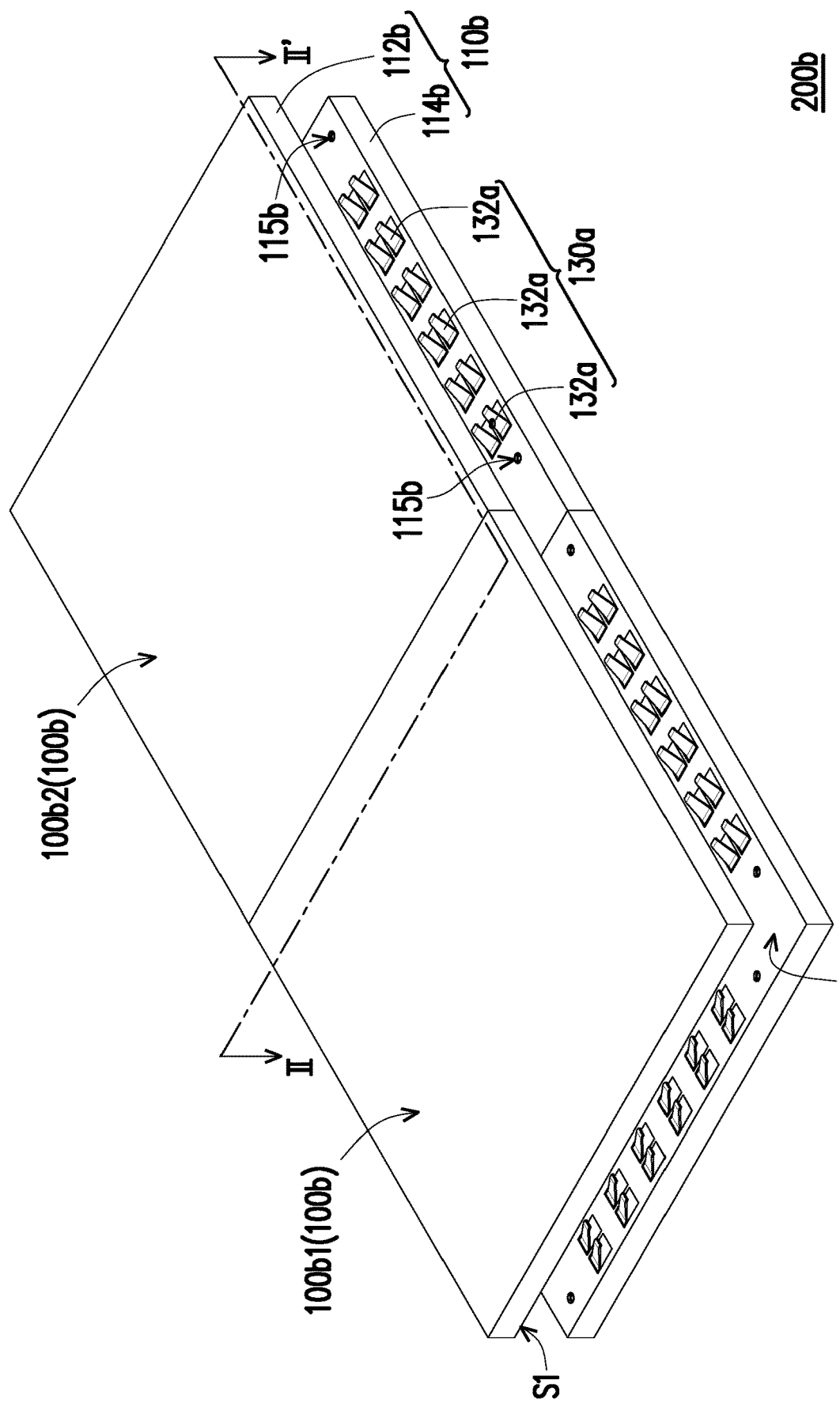
FIG. 2C is a three-dimensional schematic view of multiple circuit board structures of FIG. 2A being spliced into a spliced circuit board.
Figure 2D:
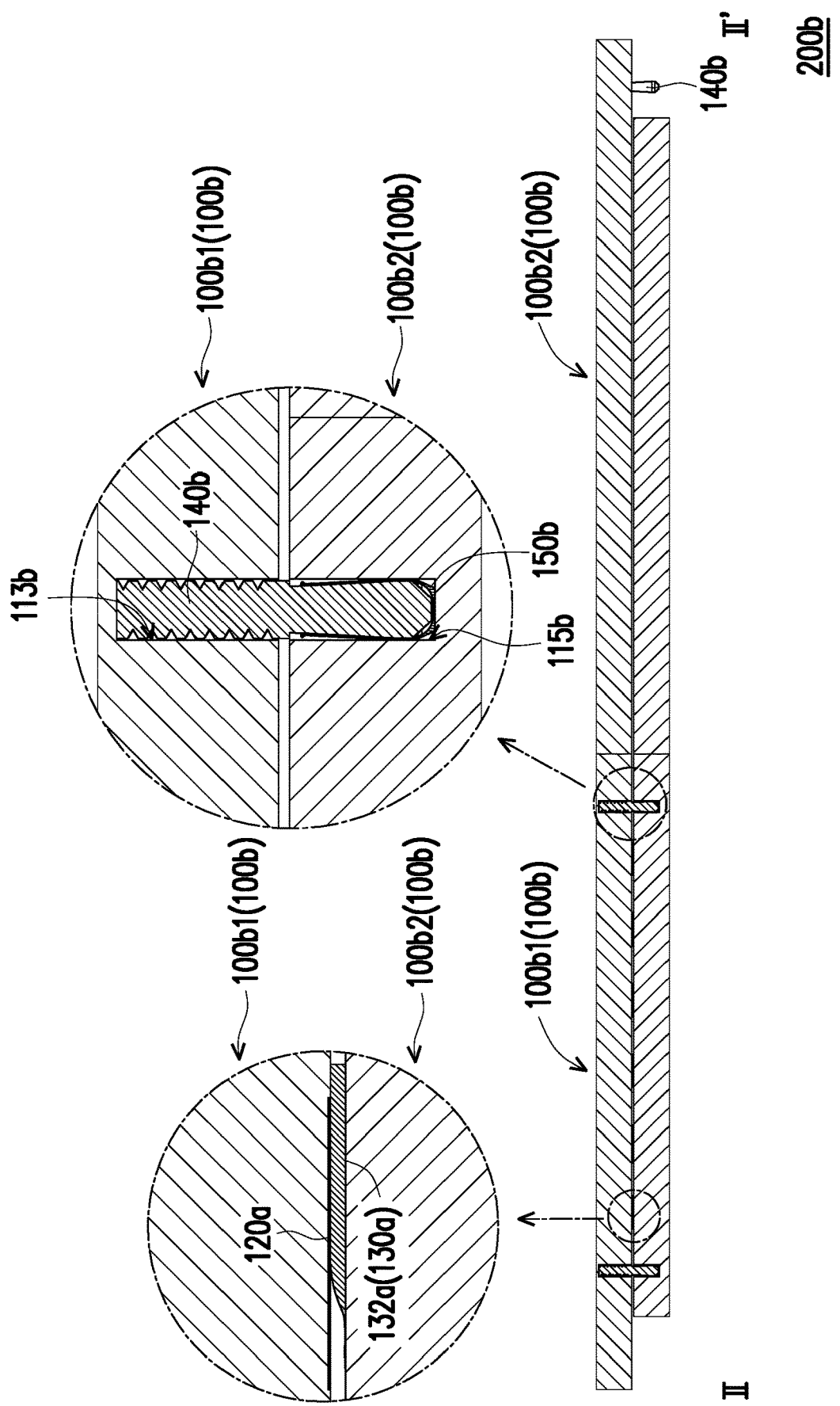
FIG. 2D is a schematic cross-sectional view taken along a line II to II' of FIG. 2C.

FIG. 2A is a three-dimensional schematic view of a circuit board structure according to another embodiment of the disclosure. FIG. 2B is a three-dimensional schematic view of the circuit board structure of FIG. 2A from another perspective. FIG. 2C is a three-dimensional schematic view of multiple circuit board structures of FIG. 2A being spliced into a spliced circuit board. FIG. 2D is a schematic cross-sectional view taken along a line II to II' of FIG. 2C. Referring to FIG. 1A, FIG. 1B, FIG. 2A, and FIG. 2B at the same time, a circuit board structure 100b according to this embodiment is similar to the circuit board structure 100a. The difference between the two is that according to this embodiment, a first portion 112b of a body 110b has multiple first grooves 113b extending inward from the first surface S1. A second portion 114b of the body 110b has multiple second grooves 115b extending inward from the second surface S2. The first engaging components 140b are respectively disposed in the first grooves 113b, and the second engaging components 150b are respectively disposed in the second grooves 115b. Referring to FIG. 2D, one of the first engaging components 140b and the second engaging components 150b is a pin, and the other of the first engaging components 140b and the second engaging components 150b is an elastic terminal. Here, the first engaging component 140b is specified as the pin, and the second engaging component 150b is specified as the elastic terminal. The pin may have a threaded design that locks into the first grooves 113b, and the terminal may be designed with burrs around the terminal to position the terminal in the second grooves 115b.

Next, referring to FIG. 2C and FIG. 2D at the same time, multiple circuit board structures 100b in FIG. 2A are spliced. A first circuit board structure 100b1 is engaged and fixed to the second engaging components 150b of a second circuit board structure 100b2 through the first engaging components 140b, so that the first pads 120a of the first circuit board structure 100b1 are electrically connected to the conductive assembly 130a of the second circuit board structure 100b2. In other words, when two circuit board structures 100b are spliced together, the first engaging components 140b (i.e., the pins) of one circuit board structure 100b may be inserted into the second engaging components 150b (i.e., the terminals) of the other circuit board structure 100b to fix the two circuit board structures 100b together. At the same time, the first pads 120a on one circuit board structure 100b are electrically connected to the conductive assembly 130a on the other circuit board structure 100b by contact, and the splicing of the two circuit board structures 100b is completed to form a spliced circuit board 200b.

FIG. 3A is a schematic top view of a circuit board structure according to another embodiment of the disclosure. FIG. 3B is a schematic bottom view of the circuit board structure of FIG. 3A. Referring to FIG. 1A, FIG. 1B, FIG. 3A, and FIG. 3B at the same time, a circuit board structure 100c according to this embodiment is similar to the circuit board structure 100a. The difference between the two is that according to this embodiment, a first region A3 of a first portion 112c of a body 110c is specified as an L-shaped region, and a second region A4 of a second portion 114c of the body 110c is specified as a long-striped region. That is, the first portion 112c of the body 110c protrudes two adjacent sides relative to the second portion 114c, and the second portion 114c of the body 110c protrudes one side relative to the first portion 112c. In short, this circuit board structure 100c can be regarded as a type for edge unit and is suitable for board edge.

Figure 4A:
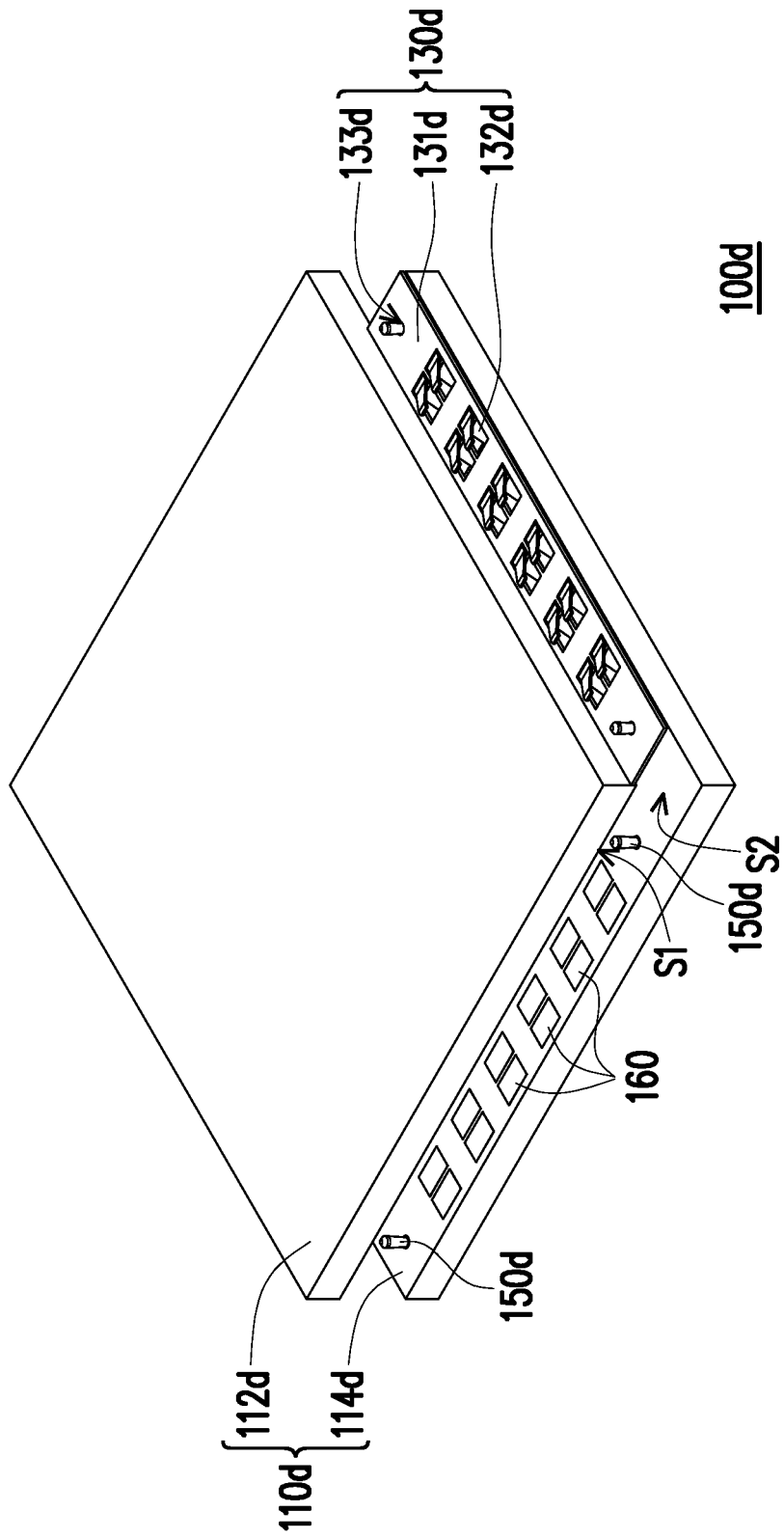
FIG. 4A is a three-dimensional schematic view of a circuit board structure according to another embodiment of the disclosure.
Figure 4B:
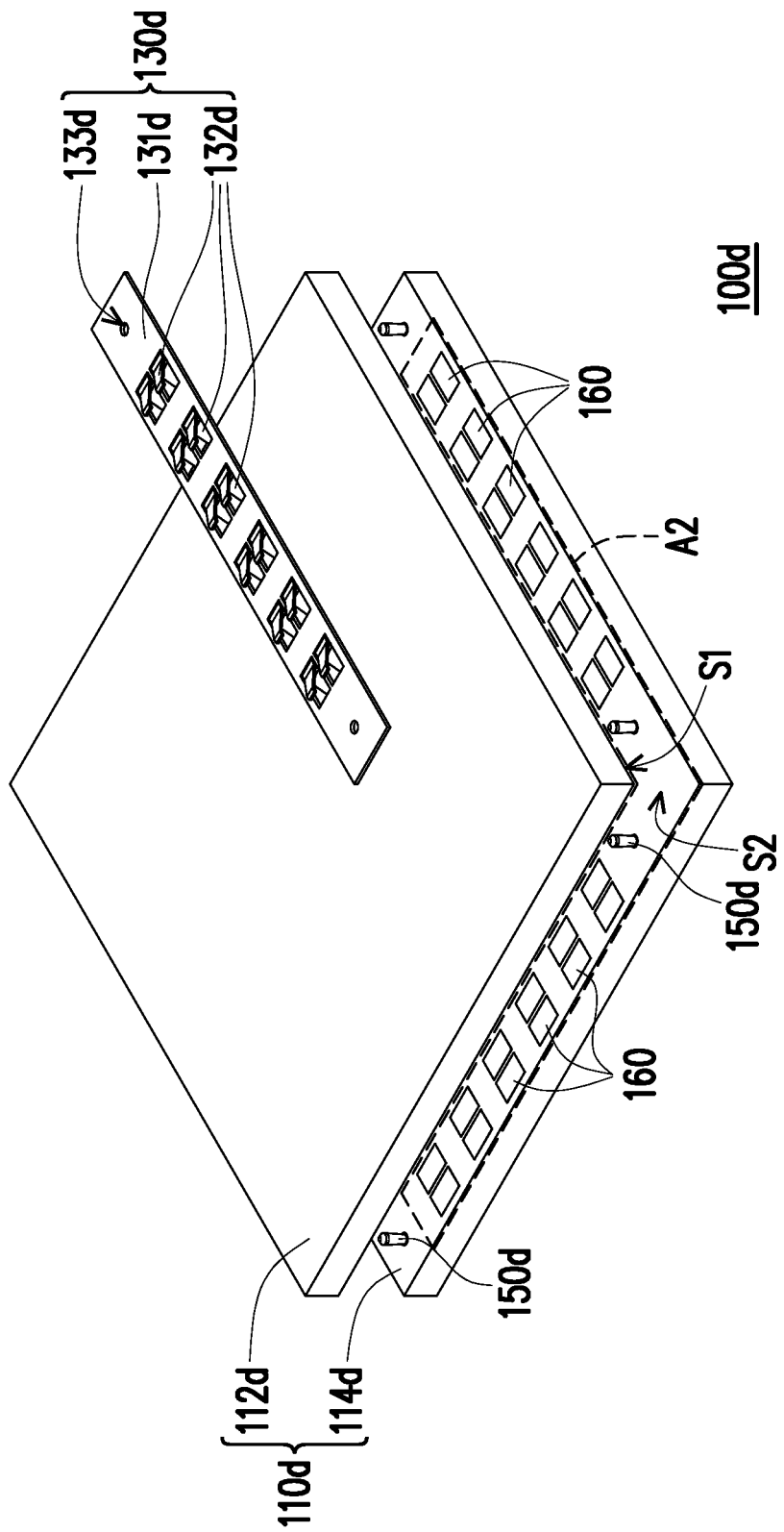
FIG. 4B is a three-dimensional exploded schematic view of a conductive assembly and a body in FIG. 4A.
Figure 4C:
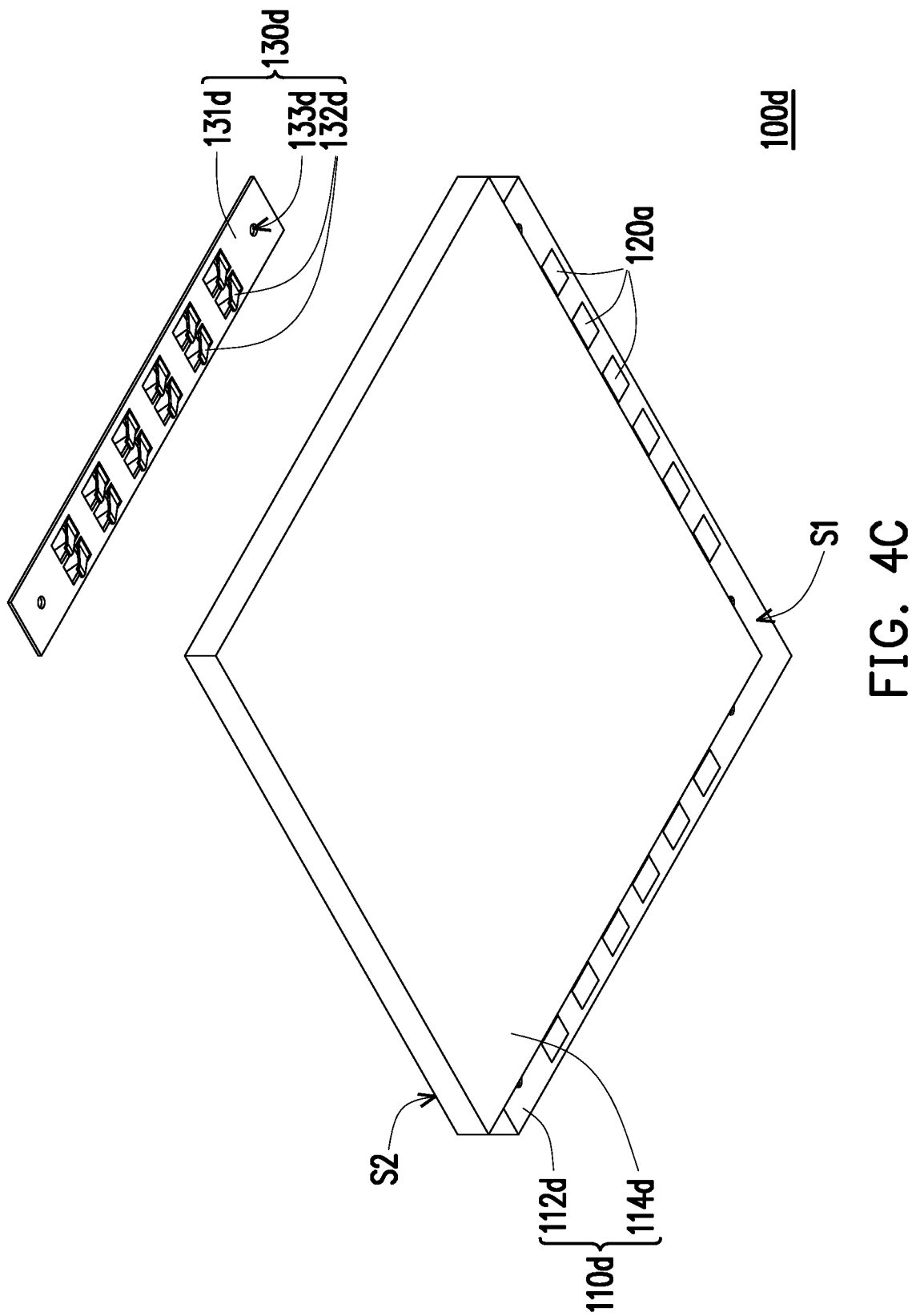
FIG. 4C is a three-dimensional exploded schematic view of the conductive assembly and the body in FIG. 4A from another perspective.
Figure 4D:
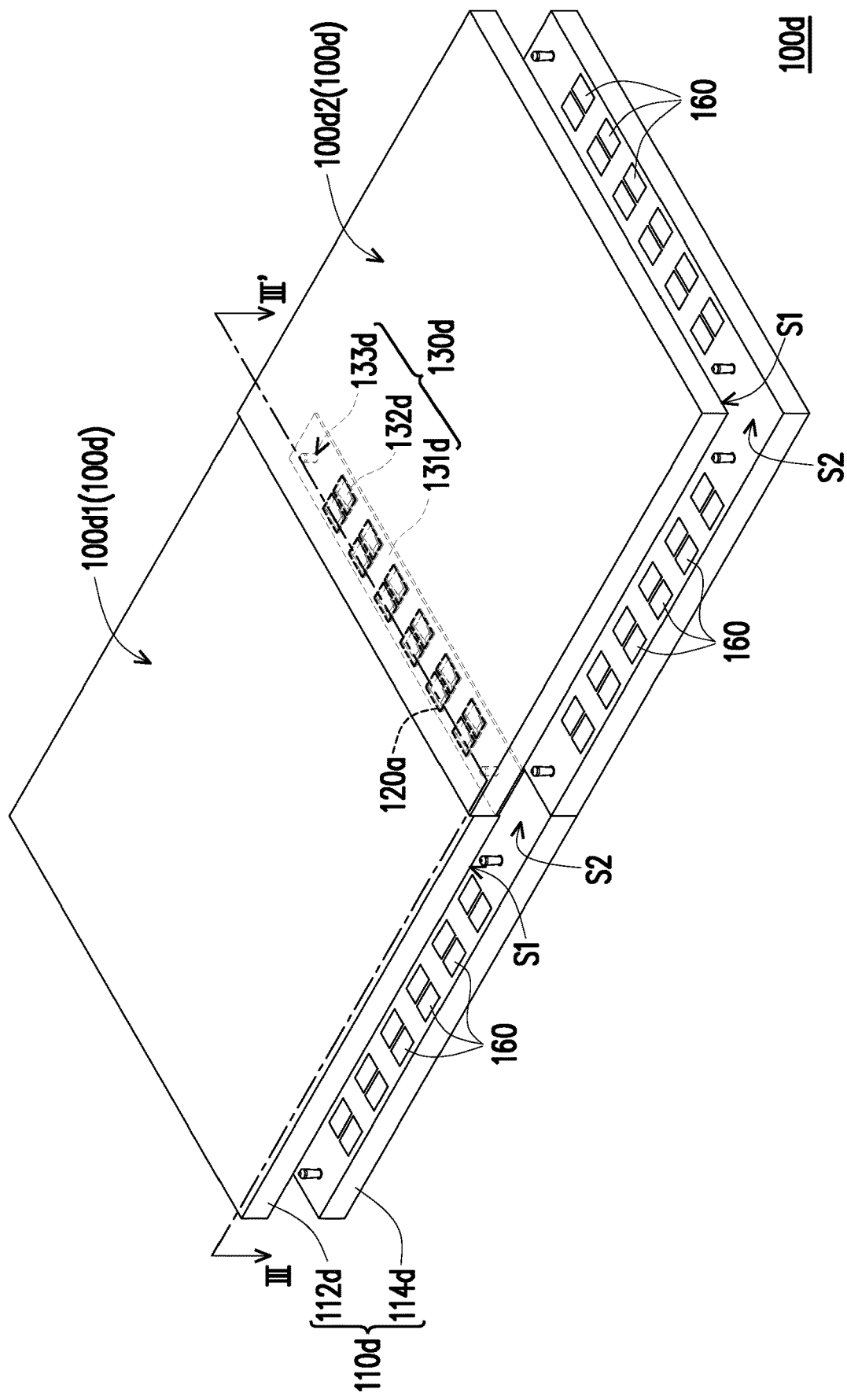
FIG. 4D is a three-dimensional schematic view of multiple circuit board structures of FIG. 4A being spliced into a spliced circuit board.
Figure 4E:
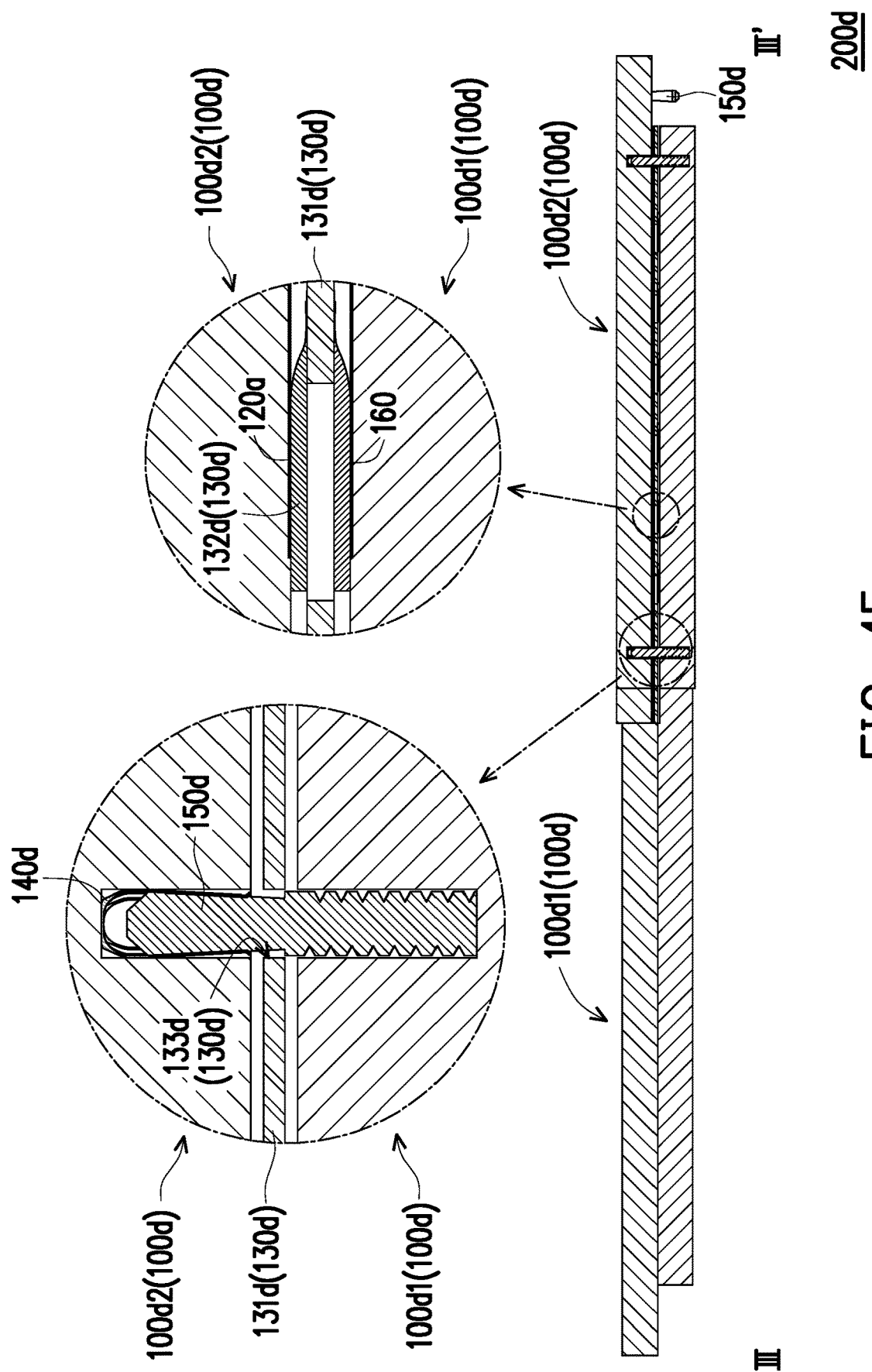
FIG. 4E is a schematic cross-sectional view taken along a line III to III' of FIG. 4D.

FIG. 4A is a three-dimensional schematic view of a circuit board structure according to another embodiment of the disclosure. FIG. 4B is a three-dimensional exploded schematic view of a conductive assembly and a body in FIG. 4A. FIG. 4C is a three-dimensional exploded schematic view of the conductive assembly and the body in FIG. 4A from another perspective. FIG. 4D is a three-dimensional schematic view of multiple circuit board structures of FIG. 4A being spliced into a spliced circuit board. FIG. 4E is a schematic cross-sectional view taken along a line III to III' of FIG. 4D. For the sake of illustration, the components of the splice are drawn in partial perspective in FIG. 4D.

Referring to FIG. 2A, FIG. 4A, FIG. 4B, and FIG. 4C at the same time. A circuit board structure 100d according to this embodiment is similar to the circuit board structure 100b. The difference between the two is that conductive spring sheets 132d according to this embodiment are not embedded on the second surface S2 of a second portion 114d. In detail, according to this embodiment, the circuit board structure 100d further includes multiple second pads 160 disposed on the second portion 114d of a body 110d and located in the second region A2 of the second surface S2. A first portion 112d of the body 110d still has the first pads 120a on the first surface S1. A conductive assembly 130d includes a substrate 131d, multiple conductive spring sheets 132d, and multiple third engaging components 133d. The conductive spring sheets 132d are disposed on the substrate 131d and are arranged correspondingly to the second pads 160. The third engaging components 133d penetrate the substrate 131d and are respectively engaged and fixed to second engaging components 150d, so that the conductive assembly 130d is positioned in the second region A2 of the second surface S2. At the same time, the conductive spring sheets 132d and the second pads 160 are electrically connected. Here, the conductive spring sheets 132d are specified as double-sided spring sheets.

Next, referring to FIG. 4D and FIG. 4E at the same time, multiple circuit board structures 100d in FIG. 4A are spliced. A first circuit board structure 100d1 is respectively engaged and fixed through first engaging components 140d to the second engaging components 150d which have been engaged and fixed by the third engaging components 133d, so that the first pads 120d of the first circuit board structure 100d1 are respectively electrically connected with the conductive assembly 130d of a second circuit board structure 100d2. Here, the first engaging component 140d is a terminal, the second engaging component 150d is a pin, and the third engaging component 133d is a slot hole. That is to say, the body 110d and the conductive assembly 130d according to this embodiment are separate components, which are assembled by engaging the second engaging components 150d and the third engaging components 133d. Then, the first engaging components 140d and the second engaging components 150d are engaged with each other, and the conductive assembly 130d is sandwiched between the first circuit board structure 100d1 and the second circuit board structure 100d2 to complete the splicing of the first circuit board structure 100d1 and the second circuit board structure 100d2. In short, when two circuit board structures 100d are spliced together, the first engaging components 140d (i.e., the terminals) of one circuit board structure 100d may be inserted into the second engaging components 150d (i.e., the pins) of the other circuit board structure 100d to fix the two circuit board structures 100d together. At the same time, the first pads 120d on one circuit board structure 100d are electrically connected to the conductive assembly 130d on the other circuit board structure 100d by contact, and the splicing of the two circuit board structures 100d is completed to form a spliced circuit board 200d.

Figure 5A:
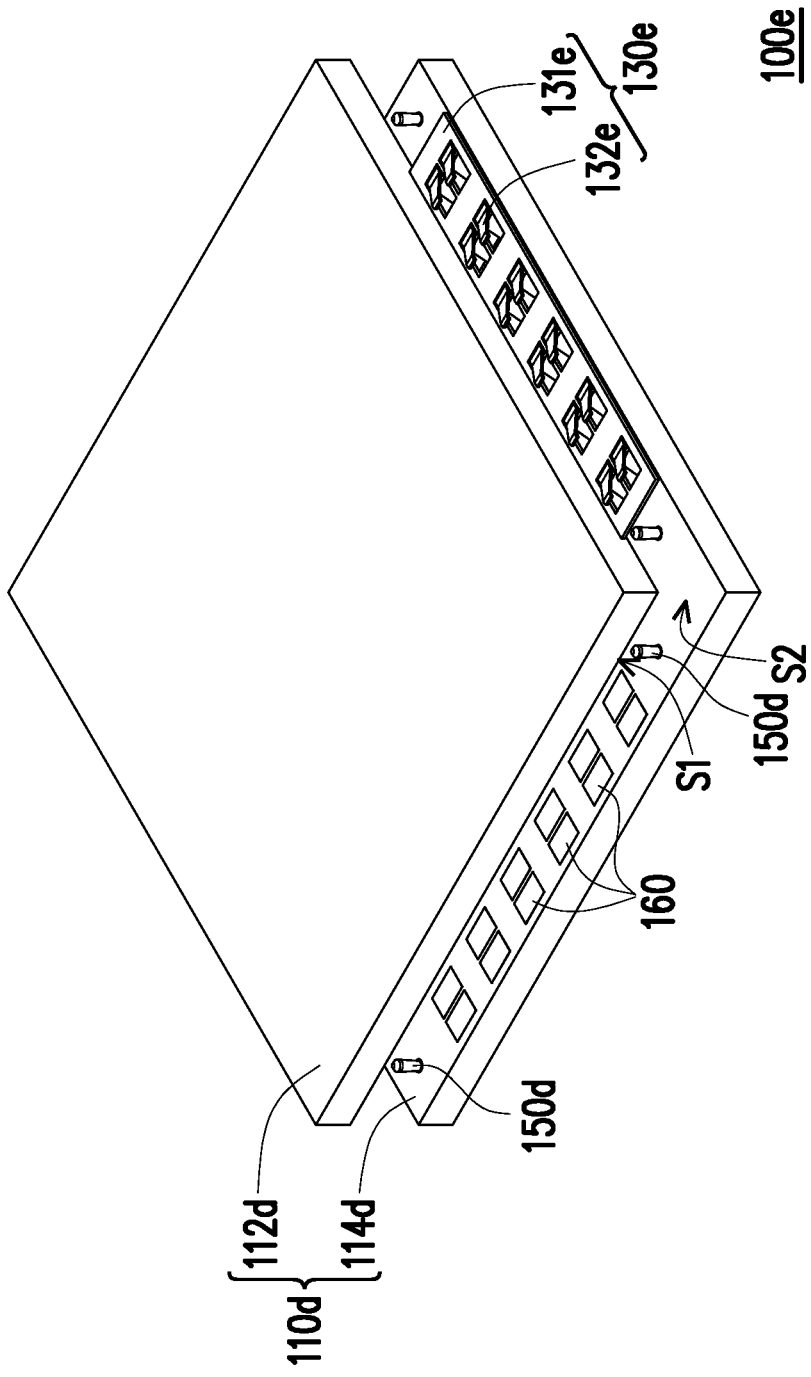
FIG. 5A is a three-dimensional schematic view of a circuit board structure according to another embodiment of the disclosure.
Figure 5B:
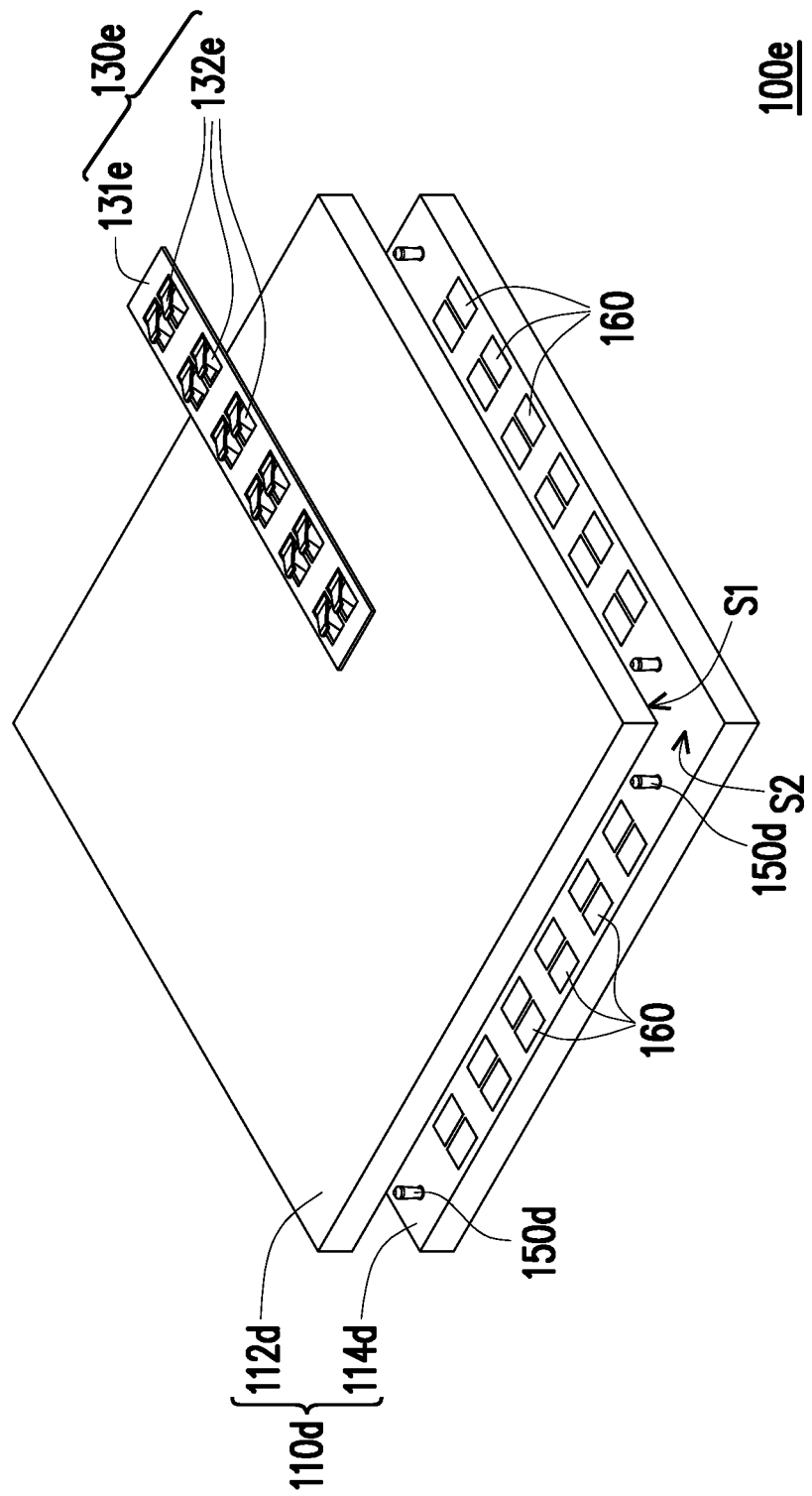
FIG. 5B is a three-dimensional exploded schematic view of a conductive assembly and a body in FIG. 5A.
Figure 5C:
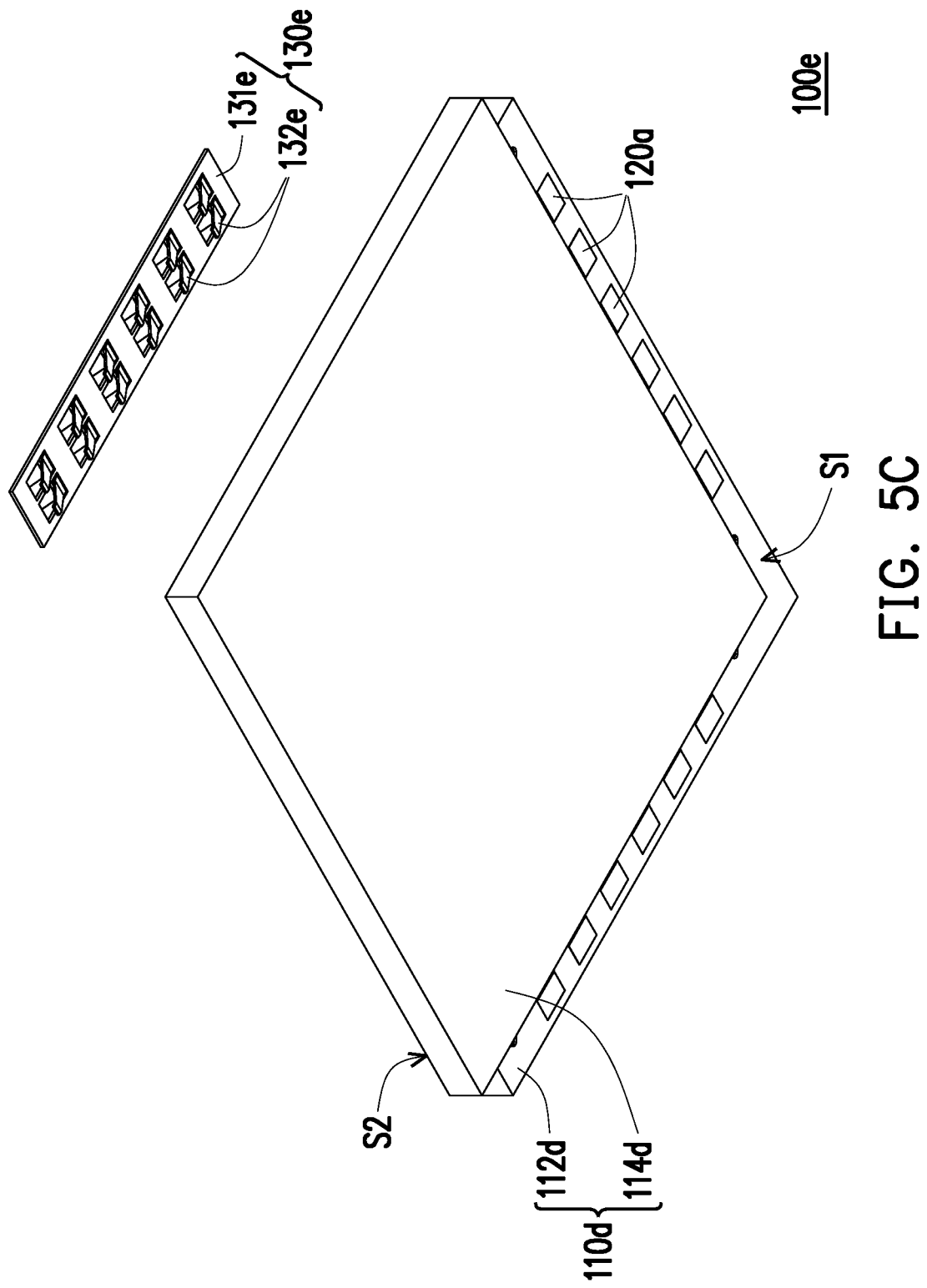
FIG. 5C is a three-dimensional exploded schematic view of the conductive assembly and the body in FIG. 5A from another perspective.
Figure 5D:
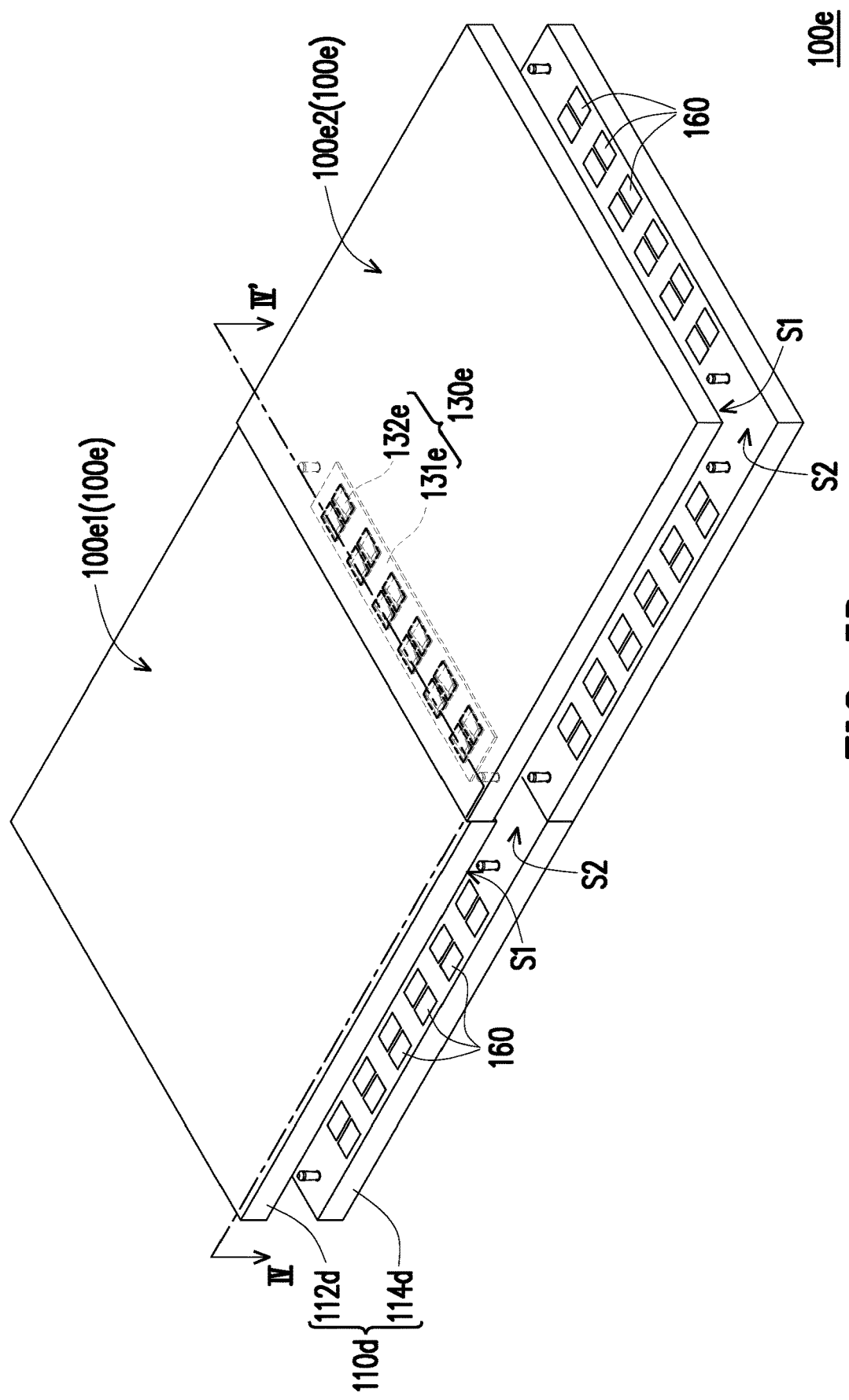
FIG. 5D is a three-dimensional schematic view of multiple circuit board structures of FIG. 5A being spliced into a spliced circuit board.
Figure 5E:
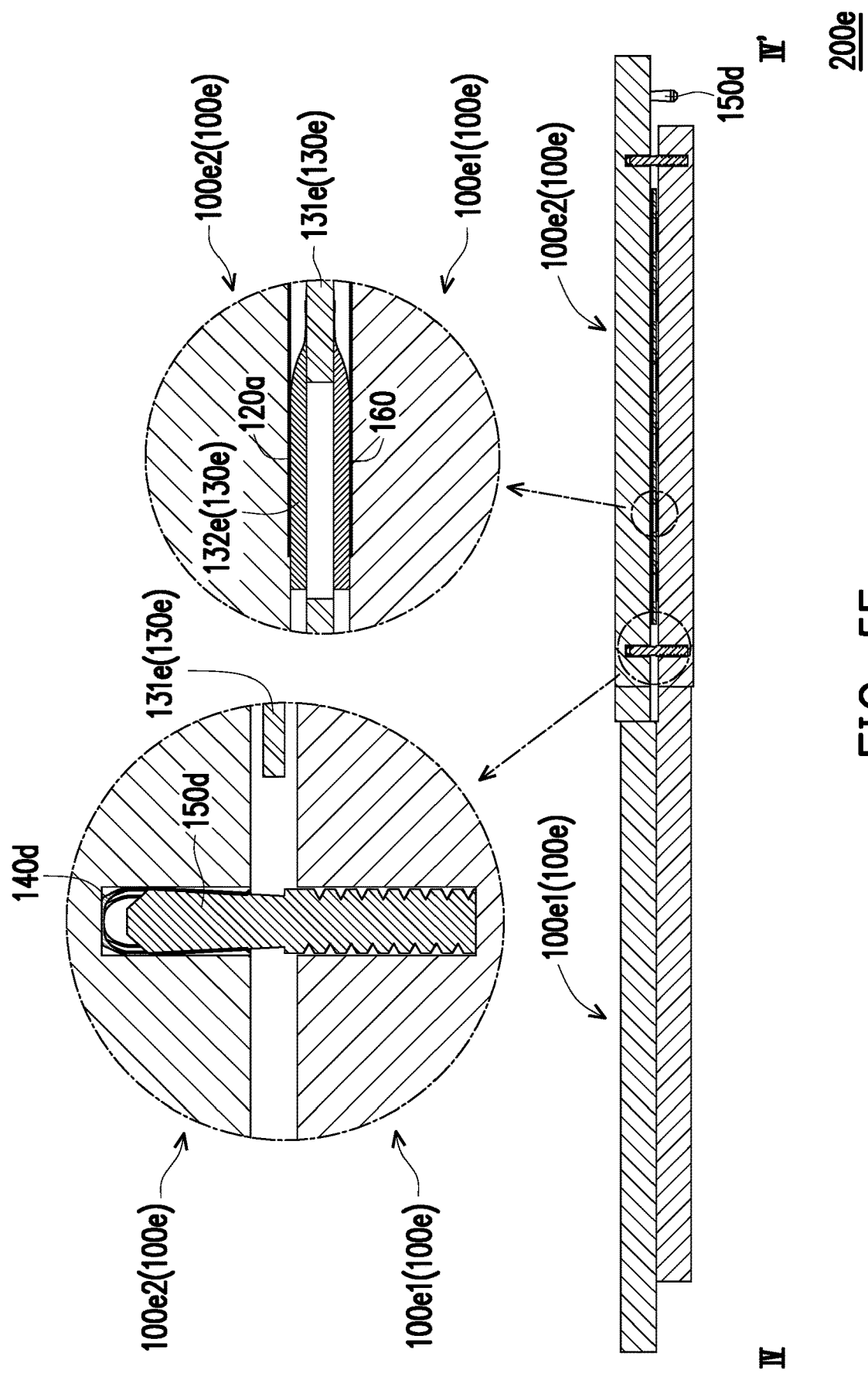
FIG. 5E is a schematic cross-sectional view taken along a line IV to IV' of FIG. 5D.

FIG. 5A is a three-dimensional schematic view of a circuit board structure according to another embodiment of the disclosure. FIG. 5B is a three-dimensional exploded schematic view of a conductive assembly and a body in FIG. 5A. FIG. 5C is a three-dimensional exploded schematic view of the conductive assembly and the body in FIG. 5A from another perspective. FIG. 5D is a three-dimensional schematic view of multiple circuit board structures of FIG. 5A being spliced into a spliced circuit board. FIG. 5E is a schematic cross-sectional view taken along a line IV to IV' of FIG. 5D. For the sake of illustration, the components of the splice are drawn in partial perspective in FIG. 5D.

Referring to FIG. 4A, FIG. 5A, FIG. 5B, and FIG. 5C at the same time, a circuit board structure 100e according to this embodiment is similar to the circuit board structure 100d. The difference between the two is that a size of a conductive assembly 130e according to this embodiment is smaller than a size of the conductive assembly 130d. In detail, according to this embodiment, the conductive assembly 130e includes a substrate 131e and multiple conductive spring sheets 132e disposed on the substrate 131e and are respectively arranged correspondingly to the second pads 160. In other words, the conductive assembly 130e according to this embodiment does not include the third engaging component 133d.

Next, referring to FIG. 5D and FIG. 5E at the same time, multiple circuit board structures 100e in FIG. 5A are spliced. A second circuit board structure 100e2 is respectively engaged and fixed to the second engaging components 150d of a first circuit board structure 100e1 through the first engaging components 140d, so that the first pads 120a of the second circuit board structure 100e2 are electrically connected to the conductive assembly 130e of the first circuit board structure 100e1. That is to say, a body 110e and conductive assembly 130e according to this embodiment are separate components, and the conductive assembly 130e is sandwiched between the first circuit board structure 100e1 and the second circuit board structure 100e2 through the first engaging components 140d engaging with the second engaging components 150d to complete the splicing of the first circuit board structure 100e1 and the second circuit board structure 100e2. In short, when two circuit board structures 100e are spliced together, the first engaging components 140d (i.e., terminals) of one circuit board structure 100e may be inserted into the second engaging components 150d (i.e., the pins) of the other circuit board structure 100e to fix the two circuit board structures 100e together. At the same time, the first pads 120e on one circuit board structure 100e are electrically connected to the conductive assembly 130e on the other circuit board structure 100e by contact, and the splicing of the two circuit board structures 100e is completed to form a spliced circuit board 200e.

In summary, in the circuit board structure of the disclosure, the first pads and the first engaging components are disposed in the first portion of the body and are located in the first region of the first surface protruding from the second portion. The conductive assembly and the second engaging components are disposed in the second portion of the body, and are located in the second region of the second surface protruding from the first portion. Therefore, when splicing the first circuit board structure and the second circuit board structure, the first circuit board structure may be respectively engaged and fixed to the second engaging components of the second circuit board structure through the first engaging components, so that the first pads of the first circuit board structure are respectively electrically connected to the conductive assembly of the second circuit board structure. In this way, the circuit board structure of the disclosure is not only suitable for splicing, which may be spliced with each other to form a large-area spliced circuit board, but also, because of small size, capable of avoiding the conventional problem of board warpage, which may have favorable production yield rate. In addition, the manufacturing yield rate may be improved by using the spliced circuit board spliced by the circuit board structures of the disclosure, and the defective circuit board structures may be easy to replace, which may reduce waste to reduce production costs.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:
1. A circuit board structure comprising:
 a body comprising a first portion and a second portion, wherein the first portion and the second portion are integrally formed, a first surface of the first portion directly contacts a second surface of the second portion, a first region of the first surface protrudes from the second portion, and a second region of the second surface protrudes from the first portion;
 a plurality of first pads disposed on the first portion of the body and located in the first region of the first surface;

a conductive assembly disposed on the second portion of the body and located in the second region of the second surface;

a plurality of first engaging components disposed on the first portion of the body and located in the first region of the first surface, wherein the first pads are located between the first engaging components; and a plurality of second engaging components disposed on the second portion of the body and located in the second region of the second surface, wherein the conductive assembly is located between the second engaging components.

2. The circuit board structure according to claim 1, wherein the conductive assembly comprises a plurality of conductive spring sheets embedded on the second surface of the second portion.

3. The circuit board structure according to claim 2, wherein the first region and the second region are respectively an L-shaped region.

4. The circuit board structure according to claim 2, wherein the first region is an L-shaped region, and the second region is a long-striped region.

5. The circuit board structure according to claim 1, wherein one of each of the first engaging components and each of the second engaging components is a slot hole, and an other of the each of the first engaging components and the each of the second engaging components is a snap.

6. The circuit board structure according to claim 1, wherein the first portion has a plurality of first grooves extending inward from the first surface, the second portion has a plurality of second grooves extending inward from the second surface, the first engaging components are respectively disposed in the first grooves, and the second engaging components are respectively disposed in the second grooves.

7. The circuit board structure according to claim 6, wherein one of each of the first engaging components and each of the second engaging components is a pin, and an other of the each of the first engaging components and the each of the second engaging components is an elastic terminal.

8. The circuit board structure according to claim 1 further comprising:

a plurality of second pads disposed on the second portion of the body and located in the second region of the second surface, and the conductive assembly comprising a substrate, a plurality of conductive spring sheets, and a plurality of third engaging components, wherein the conductive spring sheets are disposed on the substrate and are arranged correspondingly to the second pads, and the third engaging components penetrate the substrate and are respectively engaged and fixed to the second engaging components, such that the conductive assembly is positioned in the second region of the second surface.

9. The circuit board structure according to claim 8, wherein one of each of the second engaging components and each of the third engaging components is a slot hole, and an other of the each of the second engaging components and the each of the third engaging components is a locking block.

10. The circuit board structure according to claim 1 further comprising:

a plurality of second pads disposed on the second portion of the body and located in the second region of the second surface, and the conductive assembly comprising a substrate and a plurality of conductive spring sheets, wherein the conductive spring sheets are disposed on the substrate and are respectively arranged correspondingly to the second pads.

11. A spliced circuit board comprising:

a plurality of circuit board structures, wherein each of the circuit board structures comprises:

a body comprising a first portion and a second portion, wherein the first portion and the second portion are integrally formed, a first surface of the first portion directly contacts a second surface of the second portion, a first region of the first surface protrudes from the second portion, and a second region of the second surface protrudes from the first portion;

a plurality of first pads disposed on the first portion of the body and located in the first region of the first surface;

a conductive assembly disposed on the second portion of the body and located in the second region of the second surface;

a plurality of first engaging components disposed on the first portion of the body and located in the first region of the first surface, wherein the first pads are located between the first engaging components; and a plurality of second engaging components disposed on the second portion of the body and located in the second region of the second surface, wherein the conductive assembly is located between the second engaging components, wherein the circuit board structures comprise a first circuit board structure and a second circuit board structure, the first circuit board structure is respectively engaged and fixed to the second engaging components of the second circuit board structure through the first engaging components, such that the first pads of the first circuit board structure are respectively electrically connected to the conductive assembly of the second circuit board structure.

12. The spliced circuit board according to claim 11, wherein the conductive assembly comprises a plurality of conductive spring sheets embedded on the second surface of the second portion.

13. The spliced circuit board according to claim 12, wherein the first region and the second region are respectively an L-shaped region.

14. The spliced circuit board according to claim 12, wherein the first region is an L-shaped region, and the second region is a long-striped region.

15. The spliced circuit board according to claim 11, wherein one of each of the first engaging components and each of the second engaging components is a slot hole, and an other of the each of the first engaging component and the each of the second engaging components is a snap.

16. The spliced circuit board according to claim 11, wherein the first portion has a plurality of first grooves extending inward from the first surface, the second portion has a plurality of second grooves extending inward from the second surface, the first engaging components are respectively disposed in the first grooves, and the second engaging components are respectively disposed in the second grooves.

17. The spliced circuit board according to claim 16, wherein one of each of the first engaging components and each of the second engaging components is a pin, and an other of the each of the first engaging components and the each of the second engaging components is an elastic terminal.

18. The spliced circuit board according to claim 11, wherein the each of the circuit board structures further comprises a plurality of second pads disposed on the second portion of the body and located in the second region of the second surface, and the conductive assembly comprises a substrate, a plurality of conductive spring sheets, and a plurality of third engaging components, wherein the conductive spring sheets are disposed on the substrate and are arranged correspondingly to the second pads, and the third engaging components penetrate the substrate and are respectively engaged and fixed to the second engaging components, such that the conductive assembly is positioned on the second surface of the second region, wherein the first circuit board structure is respectively engaged and fixed to the second engaging components engaged and fixed by the third engaging components through the first engaging components, such that the first pads of the first circuit board structure are respectively electrically connected to the conductive assembly located on the second circuit board structure.

19. The spliced circuit board according to claim 18, wherein each of the first engaging components is a pin, each of the second engaging components is a terminal, and each of the third engaging components is a slot hole.

20. The spliced circuit board according to claim 11, wherein the each of the circuit board structures further comprises a plurality of second pads disposed on the second portion of the body and located in the second region of the second surface, and the conductive assembly comprises a substrate and a plurality of conductive spring sheets, wherein the conductive spring sheets are disposed on the substrate and are respectively arranged correspondingly to the second pads, wherein the first circuit board structure is respectively engaged and fixed to the second engaging components of the second circuit board structure through the first engaging components, such that the first pads of the first circuit board structure are respectively electrically connected to the conductive assembly located in the second circuit board structure.

\* \* \* \* \*